United States Patent
Iwahashi

(10) Patent No.: US 12,557,334 B2
(45) Date of Patent: Feb. 17, 2026

(54) SEMICONDUCTOR DEVICE AND MANUFACTURING METHOD OF SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Yohei Iwahashi, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 645 days.

(21) Appl. No.: 17/877,282

(22) Filed: Jul. 29, 2022

(65) Prior Publication Data

US 2023/0042721 A1 Feb. 9, 2023

(30) Foreign Application Priority Data

Aug. 3, 2021 (JP) .................................. 2021-127533

(51) Int. Cl.
  *H10D 30/66* (2025.01)
  *H01L 21/02* (2006.01)
  *H10D 30/01* (2025.01)
  *H10D 62/10* (2025.01)

(52) U.S. Cl.
  CPC ..... *H10D 30/668* (2025.01); *H01L 21/02274* (2013.01); *H10D 30/0297* (2025.01); *H10D 62/115* (2025.01)

(58) Field of Classification Search
  CPC .. H10D 30/668; H10D 30/665; H10D 62/393; H10D 62/127; H10D 12/481
  See application file for complete search history.

(56) References Cited

U.S. PATENT DOCUMENTS

| | | | |
|---|---|---|---|
| 6,700,158 B1* | 3/2004 | Cao | H10D 30/668 257/512 |
| 2003/0127702 A1* | 7/2003 | Blair | H01L 21/76229 257/E29.066 |
| 2013/0020587 A1 | 1/2013 | Hino et al. | |
| 2013/0049137 A1* | 2/2013 | Uno | H10D 84/83 257/E27.06 |
| 2015/0115355 A1* | 4/2015 | Hirler | H10D 62/111 257/331 |
| 2015/0214300 A1* | 7/2015 | Barletta | H10D 62/107 438/270 |

FOREIGN PATENT DOCUMENTS

| | | |
|---|---|---|
| JP | 2004031386 A | 1/2004 |
| JP | 2007134666 A | 5/2007 |

* cited by examiner

*Primary Examiner* — Samuel A Gebremariam
*Assistant Examiner* — Jonas T Beardsley
(74) *Attorney, Agent, or Firm* — Posz Law Group, PLC

(57) ABSTRACT

A semiconductor device includes a gate extraction portion extracted from a gate electrode and extending from an active region to an outer peripheral region so as to be disposed above an end portion of a field insulating film. The end portion of the gate field insulating film above which the gate extraction portion is disposed is inclined in such a manner that a thickness of the field insulating film increases in a direction from the active region toward the outer peripheral region.

6 Claims, 7 Drawing Sheets

SEMICONDUCTOR DEVICE AND MANUFACTURING METHOD OF SEMICONDUCTOR DEVICE

CROSS REFERENCE TO RELATED APPLICATION

The present application claims the benefit of priority from Japanese Patent Application No. 2021-127533 filed on Aug. 3, 2021. The entire disclosure of the above application is incorporated herein by reference.

TECHNICAL FIELD

The present disclosure relates to a semiconductor device and a manufacturing method of a semiconductor device.

BACKGROUND

Conventionally, there has been known a technique for suppressing a breakage of a gate insulating film due to a high voltage generated during switching.

SUMMARY

The present disclosure provides a semiconductor device that includes a gate extraction portion extracted from a gate electrode and extending from an active region to an outer peripheral region so as to be disposed above an end portion of a field insulating film. The present disclosure also provides a manufacturing method of a semiconductor device that includes a gate extraction portion disposed above an end portion of a field insulating film.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
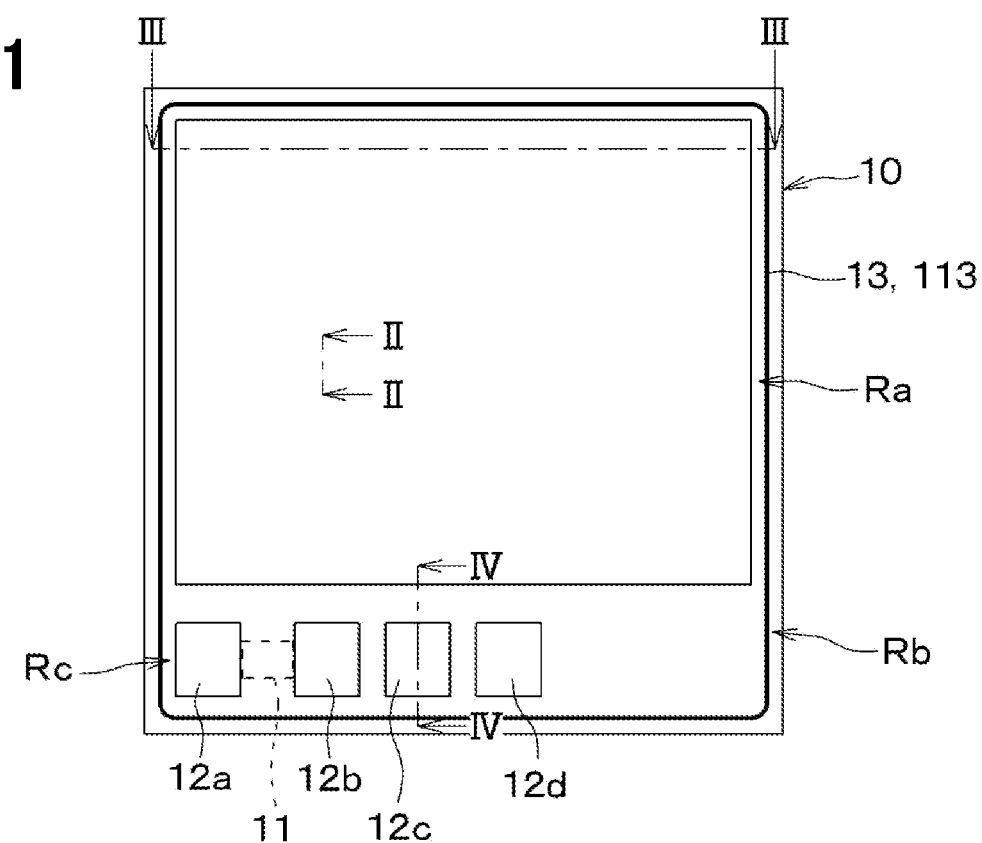
FIG. 1 is a top layout view of a semiconductor chip included in a semiconductor device according to a first embodiment.

Next, a relevant technology is described only for understanding the following embodiments. When a metal oxide semiconductor field effect transistor (MOSFET) is switched from an on-state to an off-state, a current corresponding to a capacitance between a p-type base region and an n-type drift layer flows between a source electrode and a drain electrode. This current increases with increase in time change of a drain voltage, that is, increase in dV/dt. In a portion close to the source electrode, this current flows in a region where the p-type base region and a $p^+$-type contact region are formed. In a case where resistance values of the p-type base region and the $p^+$-type contact region are high, potentials of the p-type base region and the $p^+$-type contact region rise in proportion to the magnitude of the current. That is, the potentials of the p-type base region and the $p^+$-type contact region become higher with respect to a state that the gate voltage is 0 V. Due to the rise in potential, a high voltage is applied to a gate insulating film, and the gate insulating film may be damaged. When a source contact hole penetrating a field insulating film is provided, an electric field strength applied to the gate insulating film can be reduced and the damage of the gate insulating film can be suppressed.

Depending on a structure of a semiconductor device and switching conditions, a potential difference may occur between a top and a bottom of the field insulating film formed on a semiconductor surface due to the rise in potential, so that not only the gate insulating film but also the field insulating film may be damaged. That is, a potential difference may occur between a portion of the gate electrode disposed on the field insulating film, specifically, a gate extraction portion constituting a part of a gate liner of the gate electrode and the semiconductor surface. Thickening the field insulating film is effective in suppressing the damage of the field insulating film, but due to a layout of the semiconductor device, the gate extraction portion is disposed above the field insulating film from an end of the gate electrode. Therefore, if the field insulating film is thick, the gate extraction portion becomes thin at a step portion when the gate electrode including the gate extraction portion is formed, and the gate extraction portion may break at the step portion, that is, a step breakage may occur.

A semiconductor device according to a first aspect of the present disclosure has an active region in which a switching element is disposed, an outer peripheral region surrounding an outer periphery of the active region, and a pad arrangement region in which a pad is disposed. The semiconductor device includes a semiconductor substrate, a field insulating film, a gate extraction portion, and a gate pad. The switching element is disposed in the semiconductor substrate in the active region, and has a gate electrode extending in one direction as a longitudinal direction. The field insulating film is disposed on the semiconductor substrate in the outer peripheral region and the pad arrangement region. The field insulating film has an end portion extending in a direction intersecting with the longitudinal direction of the gate electrode. The gate extraction portion is extracted from the gate electrode and extends from the active region to the outer peripheral region so as to be disposed above the end portion of the field insulating film. The gate pad is included in the pad disposed in the pad arrangement region, and is connected to the gate electrode through the gate extraction portion. The end portion of the field insulating film above which the gate extraction portion is disposed is inclined in such a manner that a thickness of the field insulating film increases in a direction from the active region toward the outer peripheral region.

In the semiconductor device according to the first aspect of the present disclosure, the end portion of the field insulating film located under the gate extraction portion is in an inclined state. Therefore, it is possible to suppress the gate extraction portion from becoming thin at a stepped portion at the end portion of the field insulating film. Accordingly, it is possible to suppress the gate extraction portion from breaking due to a step at the end portion of the field insulating film. Therefore, the semiconductor device can have a structure in which a breakage of the gate extraction portion is suppressed while the field insulating film has a film thickness enough to suppress a dielectric breakdown.

A semiconductor device according to a second aspect of the present disclosure has an active region in which a switching element is disposed, an outer peripheral region surrounding an outer periphery of the active region, and a pad arrangement region in which a pad is disposed. The semiconductor device includes a semiconductor substrate, a field insulating film, a gate extraction portion, and a gate pad. The switching element is disposed in the substrate in the active region, and has a gate electrode extending in one direction as a longitudinal direction. The field insulating film is disposed on the semiconductor substrate in the outer peripheral region and the pad arrangement region. The field insulating film has an end portion extending in a direction intersecting with the longitudinal direction of the gate electrode. The gate extraction portion is extracted from the gate electrode and extends from the active region to the outer peripheral region so as to be disposed above the end portion of the field insulating film. The gate pad is included in the pad disposed in the pad arrangement region, and is connected to the gate electrode through the gate extraction portion. A portion in the end portion of the field insulating film located in the outer peripheral region and above which the gate extraction portion is disposed is a thin film portion, a portion in the end portion of the field insulating film located in the pad arrangement region and above which the gate extraction portion is not disposed is a thick film portion, and a thickness of the thin film portion is thinner than a thickness of the thick film portion.

In the semiconductor device according to the second aspect of the present disclosure, a step portion due to the end portion of the field insulating film located under the gate extraction portion can be lowered. Therefore, even if the gate extraction portion is disposed above the step portion, a step breakage of the gate extraction portion can be suppressed. Furthermore, the field insulating film can be made thick enough to suppress a dielectric breakdown in the portion which is far from the active region and at which a high potential difference is generated between the gate wiring layer and the semiconductor surface during switching. Therefore, the semiconductor device can have a structure in which a break of the gate extraction portion is suppressed while the field insulating film has a film thickness enough to suppress a dielectric breakdown.

A manufacturing method according to a third aspect of the present disclosure is a manufacturing method of a semiconductor device having an active region in which a switching element is disposed, an outer peripheral region surrounding an outer periphery of the active region, and a pad arrangement region in which a pad is disposed. In the manufacturing method, a semiconductor substrate in which the switching element is to be formed is prepared, and a gate trench extending in one direction as a longitudinal direction is formed in the active region. Then, a field insulating film is formed on the semiconductor substrate including the outer peripheral region and the pad arrangement region in addition to an inside of the gate trench by a film forming process that causes a thickness of the field insulating film to decrease with increase in device surface area. The field insulating film is patterned to form, in the outer peripheral region and the pad arrangement region, the field insulating film that has an end portion extending in a direction intersecting with the longitudinal direction of the gate trench. Then, a gate insulating film is formed in the gate trench, a polysilicon film is formed on the gate insulating film including the inside of the gate trench, and the polysilicon film is patterned to form a gate electrode that has a gate extraction portion extracted outside the gate trench. When forming the field insulating film, a portion in the end portion of the field insulating film located in the outer peripheral region and above which the gate extraction portion is disposed is formed as a thin film portion, a portion in the end portion of the field insulating film located in the pad arrangement region and above which the gate extraction portion is not disposed is formed as a thick film portion, and a thickness of the thin film portion is thinner than a thickness of the thick film portion.

As described above, by using the film forming process that causes the film thickness to decrease with increase in device surface area, the field insulating film can be made thinner in the active region where the gate trench is formed or in the vicinity of the active region. Therefore, in a portion of the outer peripheral region adjacent to the active region, the thin film portion thinner than the field insulating film in the pad arrangement region is formed. In the pad arrangement region and a portion of the outer peripheral region that is far from the active region, the thick film portion in which the field insulating film is thicker than that in the thin film portion is formed. Accordingly, the step portion due to the end portion of the field insulating film located under the gate extraction portion can be lowered. Therefore, even if the gate extraction portion is disposed above the step portion, a step breakage of the gate extraction portion can be suppressed. Furthermore, the field insulating film can be made thick enough to suppress a dielectric breakdown in the portion which is far from the active region and at which a high potential difference is generated between the gate wiring layer and the semiconductor surface during switching. Therefore, the manufacturing method can manufacture the semiconductor device having a structure in which a breakage of the gate extraction portion is suppressed while the field insulating film has a film thickness enough to suppress a dielectric breakdown.

Hereinafter, embodiments of the present disclosure will be described with reference to the drawings. In the embodiments described hereinafter, the same or equivalent parts will be designated with the same reference numerals.

First Embodiment

The following describes a first embodiment. First, a configuration of a semiconductor device according to the first embodiment will be described with reference to FIGS. 1 to 4.

As shown in FIG. 1, the semiconductor device according to the present embodiment is a semiconductor chip 10, and a MOSFET having a trench gate structure is formed as a switching element. The semiconductor device has an active region Ra, an outer peripheral region Rb located outside the active region Ra, and a pad arrangement region Rc in which pads 12a to 12d are arranged. In the active region Ra, the switching element as a semiconductor element is formed.

As shown in FIG. 1, the semiconductor chip 10 is formed of a plate having a quadrangular upper surface. An internal region including a central portion of the semiconductor chip 10, specifically, a region surrounded by a rectangular shape in FIG. 1 is defined as the active region Ra. An outer edge portion of the semiconductor chip 10 located outside the active region Ra is defined as the outer peripheral region Rb. A region outside the active region Ra and inside the outer peripheral region Rb along one side of the rectangular shape formed by the active region Ra is defined as the pad arrangement region Rc.

A temperature-sensitive element region 11, in which a temperature-sensitive element is dispose, is provided in the pad arrangement region Rc of the semiconductor chip 10, and the increase in temperature due to heat-generating elements can be grasped based on a temperature detected by the temperature-sensitive element.

A portion shown by a thick solid line provided in the outer peripheral region Rb so as to surround the active region Ra is a gate liner 13 including a gate extraction portion 109a of a gate electrode 109 and a gate wiring layer 113 in a vertical MOSFET described later. In the present embodiment, the gate liner 13 is arranged in the outer peripheral region Rb located on the outer periphery of the active region Ra.

In the pad arrangement region Rc, the pads 12a to 12d are disposed. In the present embodiment, a cathode pad 12a, an anode pad 12b, a sense pad 12c, and a gate pad 12d are disposed in the pad arrangement region Rc from a left side of FIG. 1. These pads 12a to 12d are electrically connected to a part of the temperature-sensitive element provided in the temperature-sensitive element region 11 and parts of the vertical MOSFET provided in the active region Ra. By connecting each of these pads 12a to 12d to a bonding wire (not shown), electrical connection with the outside can be made.

Figure 2:
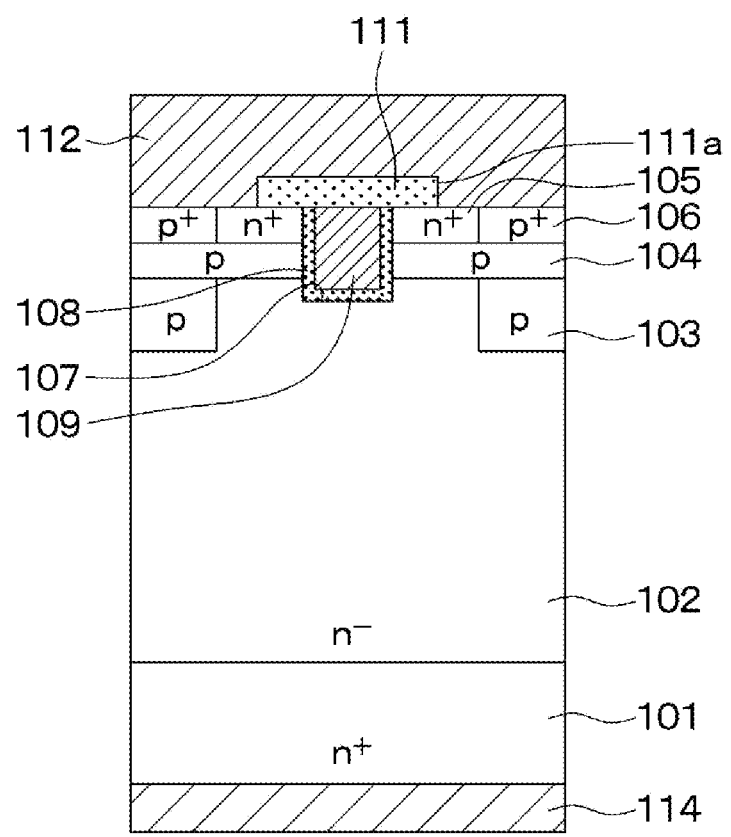
FIG. 2 is a cross-sectional view of the semiconductor chip taken along line II-II in FIG. 1.
Figure 3:
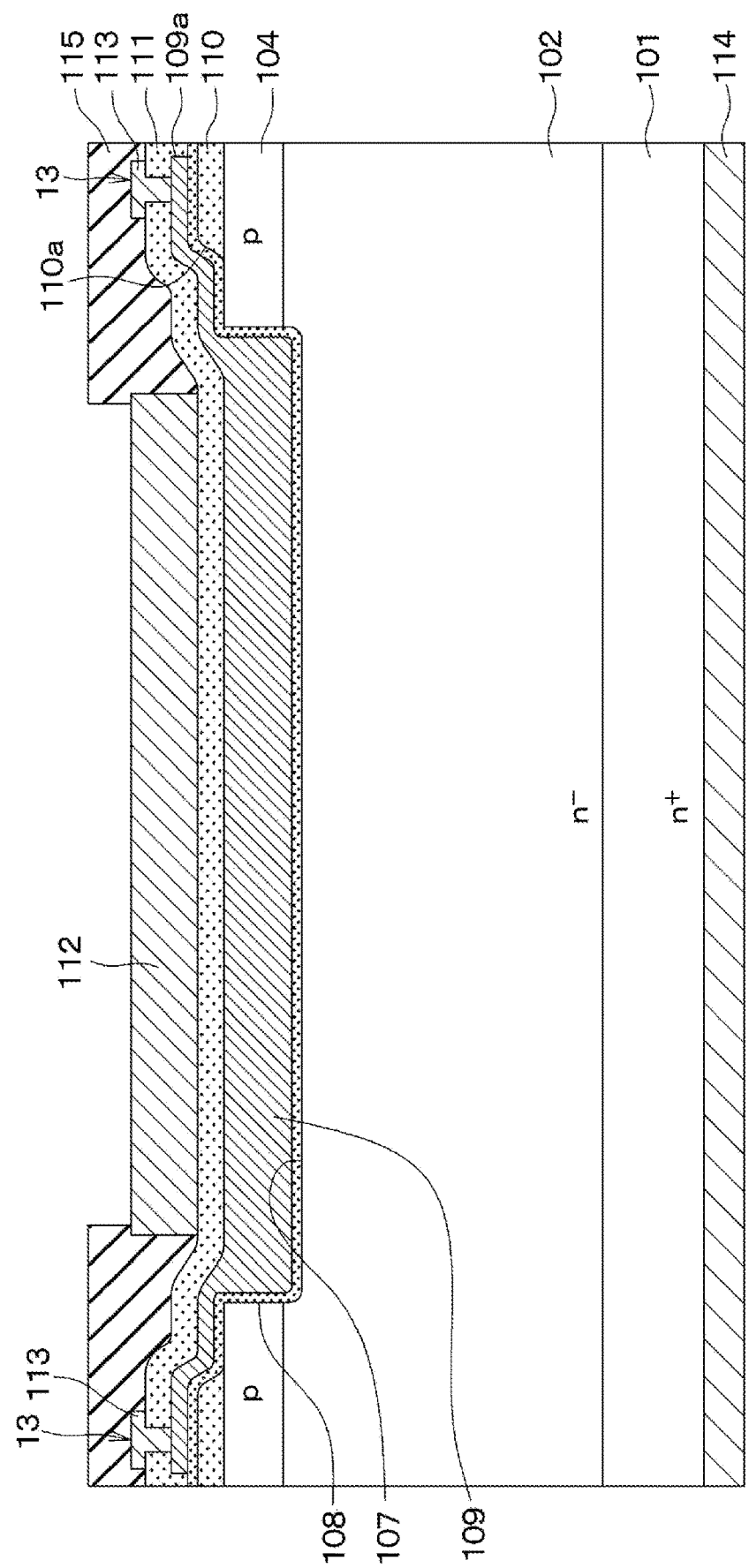
FIG. 3 is a cross-sectional view of the semiconductor chip taken along line III-III in FIG. 1.
Figure 4:
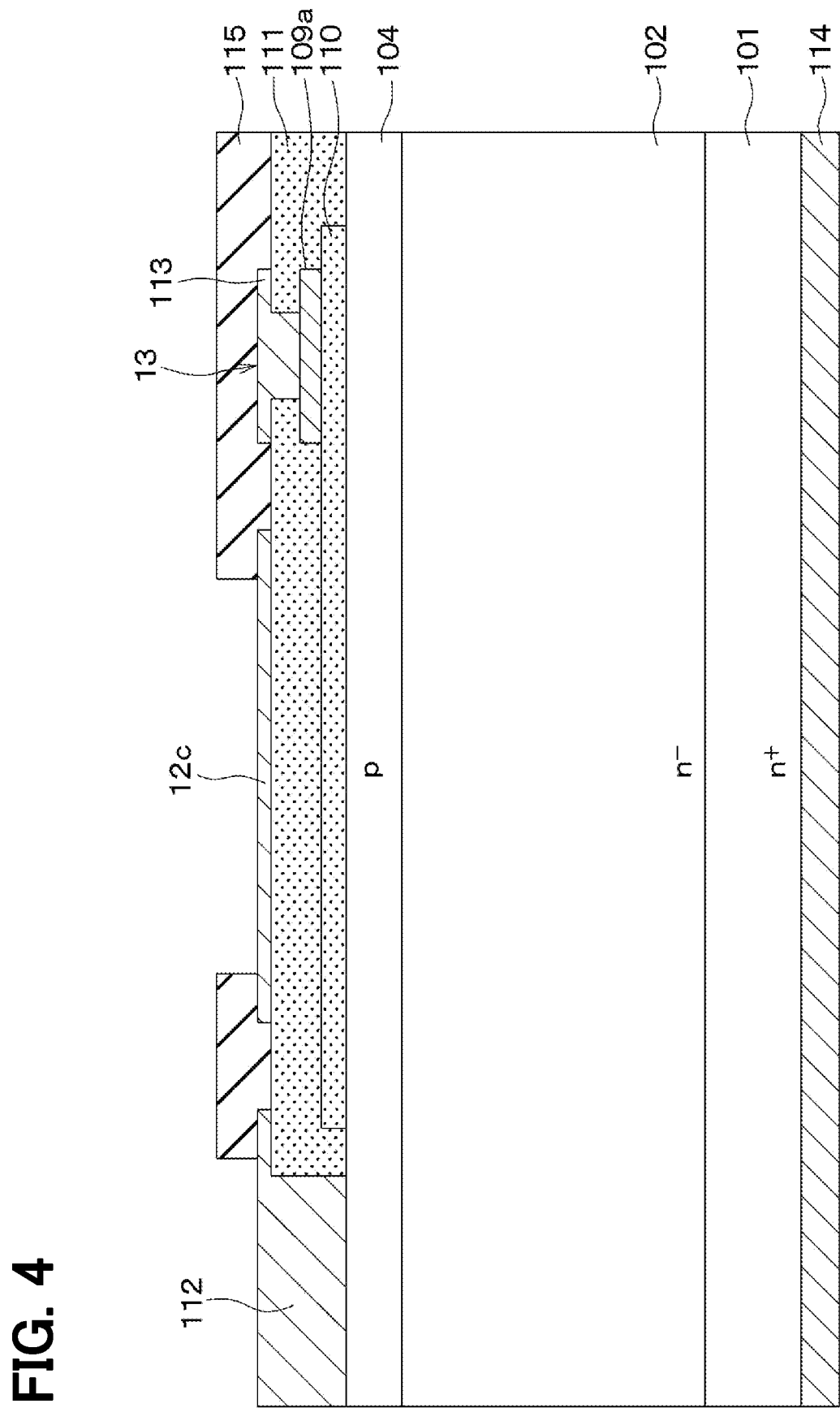
FIG. 4 is a cross-sectional view of the semiconductor chip taken along line IV-IV in FIG. 1.

Cross-sectional configurations of some parts of the semiconductor chip 10 are shown in FIGS. 2 to 4.

An $n^+$-type substrate 101 made of SiC, Si, or the like is used for the semiconductor chip 10, and parts constituting the vertical MOSFET and the temperature-sensitive element are formed on a main surface of the $n^+$-type substrate 101.

Specifically, as shown in FIG. 2, an $n^-$-type low concentration layer 102 having a lower impurity concentration than the $n^+$-type substrate 101 is epitaxially grown on the main surface of the $n^+$-type substrate 101. P-type deep layers 103 are formed at predetermined intervals on a surface layer portion of the $n^-$-type low concentration layer 102 at positions far from the $n^+$-type substrate 101. Further, a p-type base region 104 is formed on the n'-type low concentration layer 102 and the p-type deep layers 103, and an $n^+$-type source region 105 and a $p^+$-type contact region 106 are formed on the p-type base region 104. The $n^+$-type source region 105 is formed above a portion of the $n^-$-type low concentration layer 102 where the p-type deep layer 103 is not formed, and the $p^+$-type contact region 106 is formed above the p-type deep layer 103.

The $n^+$-type substrate 101, the $n^-$-type low concentration layer 102, the p-type deep layer 103, the p-type base region 104, the $n^+$-type source region 105, and the $p^+$-type contact region 106 are formed of semiconductors and form a semiconductor substrate. A gate trench 107 is formed at a surface layer portion of the semiconductor substrate. Specifically, the gate trench 107 penetrates the $n^+$-type source region 105 and the p-type base region 104 and reaches the $n^-$-type low concentration layer 102. The p-type base region 104 and $n^+$-type source region 105 are arranged so as to be in contact with side surfaces of the gate trench 107. The gate trench 107 is provided in a linear layout with a lateral direction of FIG. 2 as a width direction, a vertical direction of FIG. 2 as a depth direction, and a direction perpendicular to the width direction and the depth direction as a longitudinal direction. Although only one gate trench 107 is shown in FIG. 2, multiple gate trenches 107 are disposed at a regular interval in the lateral direction, and each of the gate trenches 107 is sandwiched between the p-type deep layers 103 so as to have a stripe shape.

A portion of the p-type base region 104 located on the side surface of the gate trench 107 is regarded as a channel region connecting the $n^+$-type source region 105 and the $n^-$-type low concentration layer 102 when the vertical MOSFET is operated. A gate insulating film 108 is formed on an inner wall surface of the gate trench 107 including the channel region. A gate electrode 109 composed of doped polysilicon is formed on a surface of the gate insulating film 108, and the gate insulating film 108 and the gate electrode 109 are embedded in the gate trench 107. Therefore, the gate electrode 109 extends in a same direction as the longitudinal direction of the gate trench 107. The trench gate structure is formed by the above-described structure.

As shown in the cross-sectional view of FIG. 3, the trench gate structure extends in the longitudinal direction. Then, as shown in FIG. 3, the trench gate structure is formed so as to project to the outside of the active region Ra. The $n^+$-type source region 105 is formed on the side surface of the gate trench 107, but the $n^+$-type source region 105 is formed in the active region Ra and is not formed outside the active region Ra. Therefore, the channel region is formed only in the active region Ra.

In the active region Ra having the rectangular shape, at least on a side located at each tip of the trench gate structure, as shown in FIG. 3, a field insulating film 110 is formed on the surface of the p-type base region 104 at a position far from each tip of the gate trench 107. The field insulating film 110 has an end portion 110a extending in a direction intersecting with the longitudinal direction of the trench gate structure. In the present embodiment, the field insulating film 110 has an open end that is opened in the active region Ra. The open end faces the tip of the trench gate structure. Although not shown in FIG. 3, the open end of the field insulating film 110 is located along upper and lower sides of the active region Ra having the rectangular shape in FIG. 1.

The field insulating film 110 is thickened so as not to be damaged even when a high voltage is applied. The gate insulating film 108 formed in the gate trench 107 is also formed outside the gate trench 107 and is also formed on a surface of the field insulating film 110. At least a portion in the end portion 110a of the field insulating film 110 located adjacent to the active region Ra, that is, the end portion 11a adjacent to trench gate structure has an inclined surface that is inclined obliquely. The thickness of the field insulating film 110 at the end portion 110a gradually increases in a direction from the active region Ra toward the outer peripheral region Rb. The gate electrode 109 is disposed not only at the inside of the gate trench 107 but also extracted from both ends in the longitudinal direction of the gate trench 107 to the outside of the gate trench 107, and is extracted to a position above the field insulating film 110. The portion of the gate electrode 109 that is extracted to the outside of the gate trench 107 constitutes the gate extraction portion 109a that becomes a part of the gate liner 13.

The gate extraction portion 109a is disposed above the field insulating film 110 that is thickened. That is, the end portion 110a of the field insulating film 110 is located under the gate extraction portion 109a. Therefore, if the end portion 110a of the field insulating film 110 is not inclined, the gate extraction portion 109a may become thin at a step portion at the end portion 110a of the field insulating film 110, and a step breakage of the gate extraction portion 109a may occur. However, in the present embodiment, since the end portion 110a of the field insulating film 110 is inclined, it is possible to suppress an occurrence of a step breakage due to a step of the end portion 110a of the field insulating film 110. In particular, when the thickness of the gate electrode 109 including the gate extraction portion 109a is thinner than the thickness of the field insulating film 110, a step breakage is likely to occur. Even in such a case, the configuration of the present embodiment can suppress an occurrence of a step breakage.

Since the gate insulating film 108 can be appropriately patterned, it is not necessary for the gate insulating film 108 to be disposed on the surface of the field insulating film 110. For example, the gate insulating film 108 may be formed to the end of the field insulating film 110. As another example, the gate insulating film 108 may be disposed on the p-type base region 104, and the field insulating film 110 may be disposed on the gate insulating film 108.

On the other hand, as shown in FIG. 4, in the cross section passing through the pad arrangement region Rc, the active region Ra in which the trench gate structure is formed and the field insulating film 110 are separated from each other, and the gate extraction portion 109a is not disposed above the field insulating film 110. That is, the gate extraction portion 109a is not disposed above the end portion of the field insulating film 110 located in the pad arrangement region Rc that extends along the active region Ra. Therefore, the end portion of the field insulating film 110 does not necessarily have to be inclined at this portion.

As shown in FIGS. 2 to 4, an interlayer insulating film 111 is formed on the surfaces of the n+-type source region 105, the p+-type contact region 106, and the gate electrode 109 including the gate extraction portion 109a. Then, as a conductor pattern, a source electrode 112 corresponding to a surface electrode and a gate wiring layer 113 as shown in FIGS. 3 and 4 are formed on the interlayer insulating film 111. The gate wiring layer 113 referred to here is a portion constituting a part of the gate liner 13 described above, and the gate liner 13 is composed of the gate wiring layer 113 and the gate extraction portion 109a. The interlayer insulating film 111 has contact holes 111a and 111b. As shown in FIG. 2, the source electrode 112 is electrically in contact with the n+-type source region 105 and the p+-type contact region 106 through the contact hole 111a. Further, as shown in FIG. 3, the gate wiring layer 113 is electrically connected to the gate extraction portion 109a, that is, the gate electrode 109 through the contact hole 111b.

On a rear surface of the n+-type substrate 101, that is, on one surface of the n+-type substrate 101 opposite from a side to which the source electrode 112 is formed, a drain electrode 114 corresponding to a rear surface electrode and electrically connected to the n+-type substrate 101 is formed. With such a structure, the vertical MOSFET of an n-channel inverted type trench gate structure is provided. The active region Ra is configured by arranging multiple cells each including the above-described vertical MOSFET. As shown in FIG. 3, the surface of the semiconductor chip 10 is covered with a passivation film 115, and a portion of the passivation film 115 corresponding to the source electrode 112 is removed and opened. Although only a part of the passivation film 115 is illustrated in FIG. 4, a portion of the passivation film 115 corresponding to each pad 12a to 12d provided in the pad arrangement region Rc is also removed and opened. In this way, the semiconductor chip 10 provided with the vertical MOSFET is configured.

In the temperature-sensitive element region 11, for example, a temperature-sensitive diode is formed as the temperature-sensitive element. The temperature-sensitive diode is configured to include, for example, multiple stages of a PN diode composed of a p-type layer and an n-type layer formed by ion-implanting p-type impurities or n-type impurities into polysilicon. A cathode of the temperature-sensitive diode is connected to the cathode pad 12a, and an anode of the temperature-sensitive diode is connected to the anode pad 12b.

The other pads 12c and 12d provided in the pad arrangement area Rc are electrically connected to each part of the vertical MOSFET. The sense pad 12c is configured to measure the current flowing through a main cell by taking out a part of the current flowing through the element. The gate pad 12d is electrically connected to the gate electrode 109 through the gate liner 13. Accordingly, the gate voltage is applied to the gate electrode 109 through the gate pad 12d.

The semiconductor chip 10 as the semiconductor device of the present embodiment is configured as described above.

In the semiconductor device configured as described above, the end portion 110a of the field insulating film 110 located under the gate extraction portion 109a is inclined obliquely. Therefore, it is possible to suppress the gate extraction portion 109a from becoming thin at the stepped portion at the end portion 110a of the field insulating film 110. Accordingly, it is possible to suppress the gate extraction portion 109a from breaking due to a step at the end portion 110a of the field insulating film 110. Therefore, the semiconductor device can have a structure in which a breakage of the gate extraction portion 109a is suppressed while the field insulating film 110 has a film thickness enough to suppress a dielectric breakdown.

Figure 5:
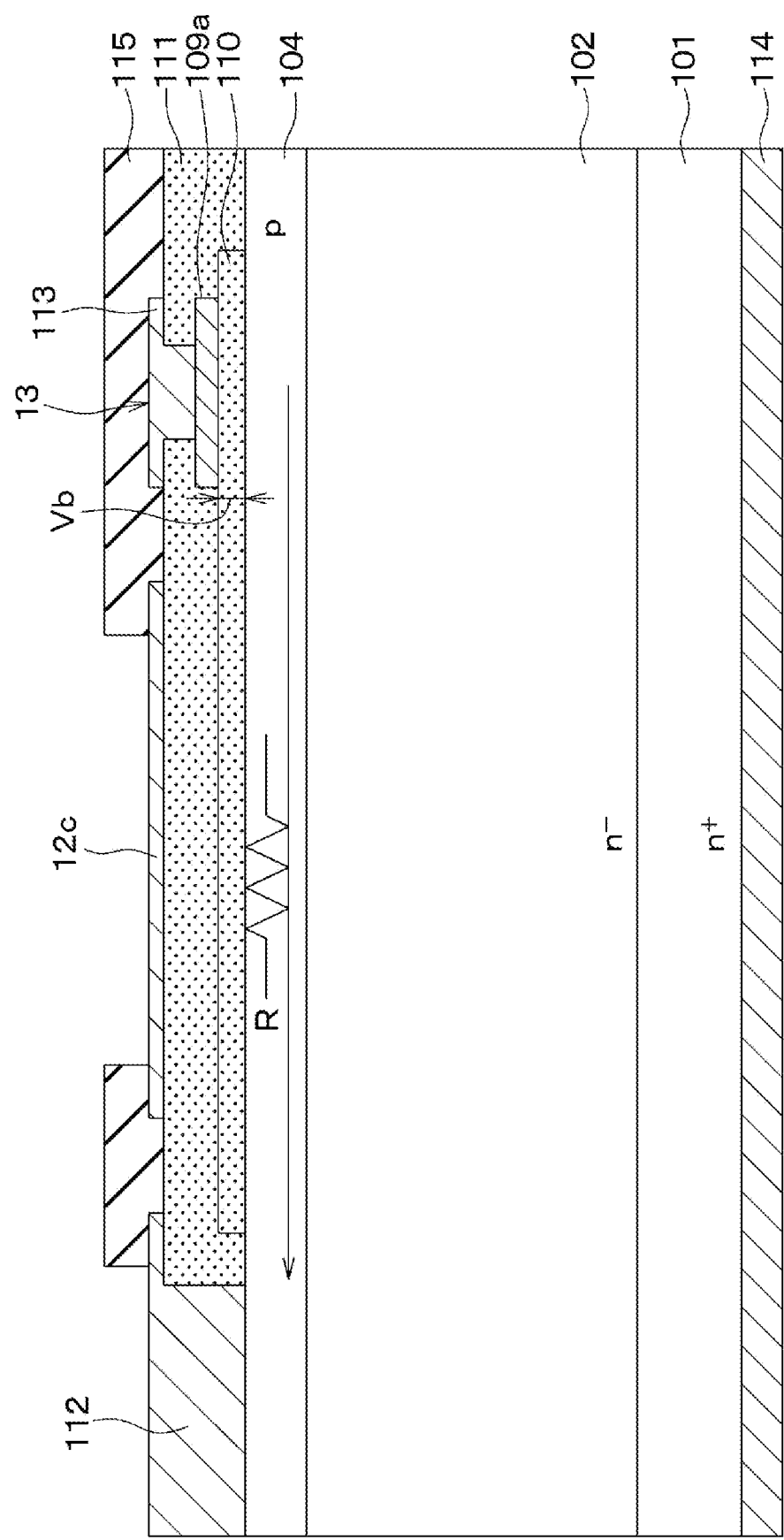
FIG. 5 is a diagram showing a current that flows during switching and a portion of a field insulating film to which a highest voltage is applied in the cross section shown in FIG. 4.

Specifically, in the cross section shown in FIG. 4, a current flows during switching as shown in FIG. 5. That is, the current flows under the field insulating film 110. Assuming that the current at this time is I and a resistance value of the semiconductor in a portion where the current I flows is R, a high potential difference having a value obtained by multiplying the current I and the resistance value R and indicated by the arrow Vb is generated between the gate wiring layer 113, which has the ground potential, and the semiconductor surface. In order to prevent a dielectric breakdown due to this high potential difference, it is necessary to thicken the field insulating film 110. With the structure according to the present embodiment, the gate extraction portion 109a can be suppressed from breaking, so that the field insulating film 110 can be made thick enough to suppress dielectric breakdown.

Figure 6:
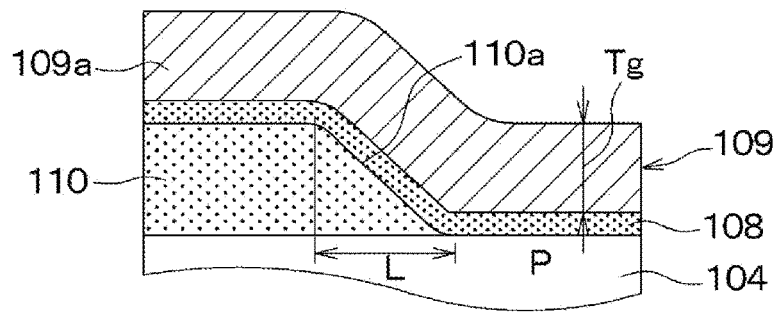
FIG. 6 is a cross-sectional view showing a relationship between a width L of a thickness transition region in an end portion of the field insulating film and a thickness Tg of a gate electrode.

When the end portion of the field insulating film 110 located under the gate extraction portion 109a is inclined, it is possible to suppress the gate extraction portion 109a from becoming thin at the stepped portion at the end portion of the field insulating film 110. However, when an angle formed by the surface of the end portion 110a of the field insulating film 110 and the surface of the semiconductor located below becomes closer to vertical, a step breakage of the gate extraction portion 109a is more likely to occur due to the step at the end portion 110a of the field insulating film 110. Therefore, it is preferable to satisfy Tg<L in the cross section shown in FIG. 6, that is, the cross section in the direction perpendicular to the direction in which the end portion 110a of the field insulating film 110 extends when the semiconductor chip 10 is viewed from above. Tg is the thickness of the gate extraction portion 109a. L is a width of a thickness transition region, which is a region where the film thickness of the end portion 110a of the field insulating film 110 changes, that is a length of the thickness transition region in a direction perpendicular to the extending direction of the end portion 110a of the field insulating film 110 when the semiconductor chip 10 is viewed from above. In this way, by making L larger than Tg, the thickness of the portion of the gate extraction portion 109a formed above the thickness transition region and the portion above the other portion can be almost the same, and a step breakage of the gate extraction portion 109a can be suppressed more certainly.

Subsequently, a manufacturing method of the semiconductor device according to the present embodiment will be described. Among processes of manufacturing the semiconductor device, a known method may be used for, for example, a process of forming the switching element including the trench gate structure. Therefore, a process of forming the field insulating film 110 will be mainly described, and the other processes will be briefly described.

First, the n⁻-type low-concentration layer 102 is formed on the main surface of the n⁺-type substrate 101, then the p-type deep layer 103 is formed by ion implantation or the like, and then the p-type base region 104 and the n⁺-type source region 105 are formed. Further, p-type impurities are ion-implanted into the n⁺-type source region 105 to form the p⁺-type contact region 106. Then, the gate trench 107 that penetrates the n⁺-type source region 105 and the p-type base region 104 and reaches the n'-type low-concentration layer 102 is formed.

Figure 7A:
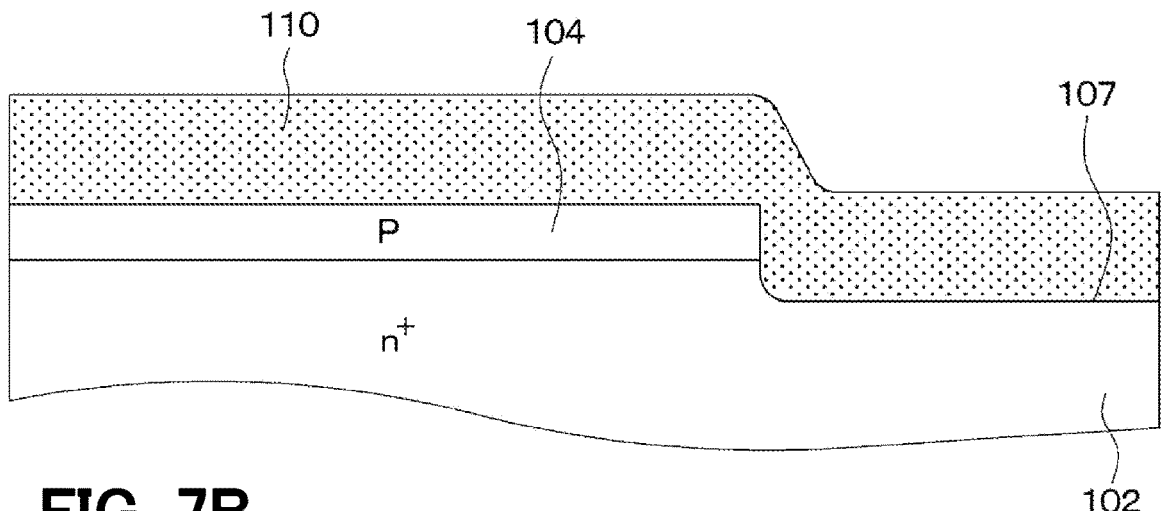
FIG. 7A is a cross-sectional view showing a process of forming the field insulating film in a manufacturing method of the semiconductor device.
Figure 7B:
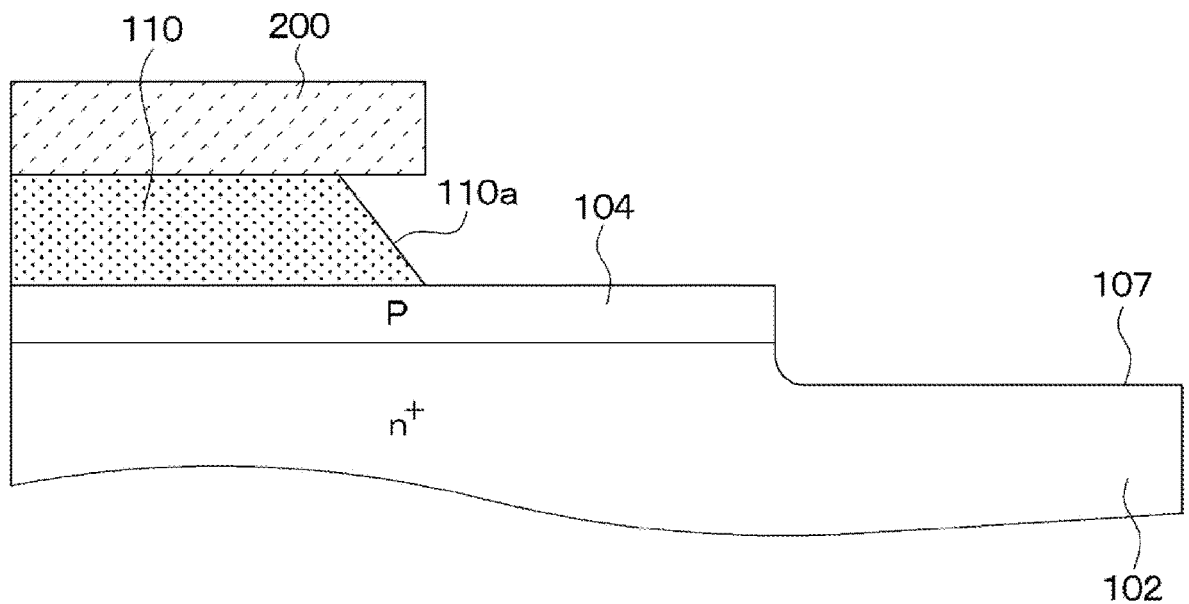
FIG. 7B is a cross-sectional view showing a process of patterning the field insulating film following FIG. 7A.

Then, as shown in FIG. 7A, the field insulating film 110 composed of an oxide film or the like is deposited on the surfaces of the semiconductors such as the p-type base region 104, the n⁺-type source region 105, and the p⁺-type contact region 106, including the inside of the gate trench 107. Then, as shown in FIG. 7B, a region left as the field insulating film 110 is covered with a photoresist mask 200 by photolithography, and the field insulating film 110 is wet-etched and patterned in this state. At this time, a lateral etching of the wet etching causes the end portion 110a of the field insulating film 110 to have an obliquely inclined shape. After this, although not shown, a process of forming the gate insulating film 108, a process of forming the gate electrode 109 including the gate extraction portion 109a by forming and patterning the polysilicon film, processes of forming the interlayer insulating film 111 and forming the contact holes 111a and 111b are performed. Further, a process of forming the source electrode 112 and the gate wiring layer 113 by forming and patterning a wiring electrode material, a process of forming and patterning the passivation film 115, and a process of forming the drain electrode 114 on the rear surface of the n⁺-type substrate 101 are performed. Accordingly, the semiconductor device of the present embodiment can be manufactured.

Second Embodiment

The following describes a second embodiment. The present embodiment is different from the first embodiment in that the shape of the end portion 110a of the field insulating film 110 is changed from that of the first embodiment and the other parts are similar to those of the first embodiment. Therefore, only the part different from the first embodiment will be described below.

In the first embodiment, the end portion 110a of the field insulating film 110 is formed to have the obliquely inclined shape by wet etching as shown in FIG. 7B. In this case, the entire region of the end portion 110a of the field insulating film 110 is configured as the inclined surface.

Figure 8:
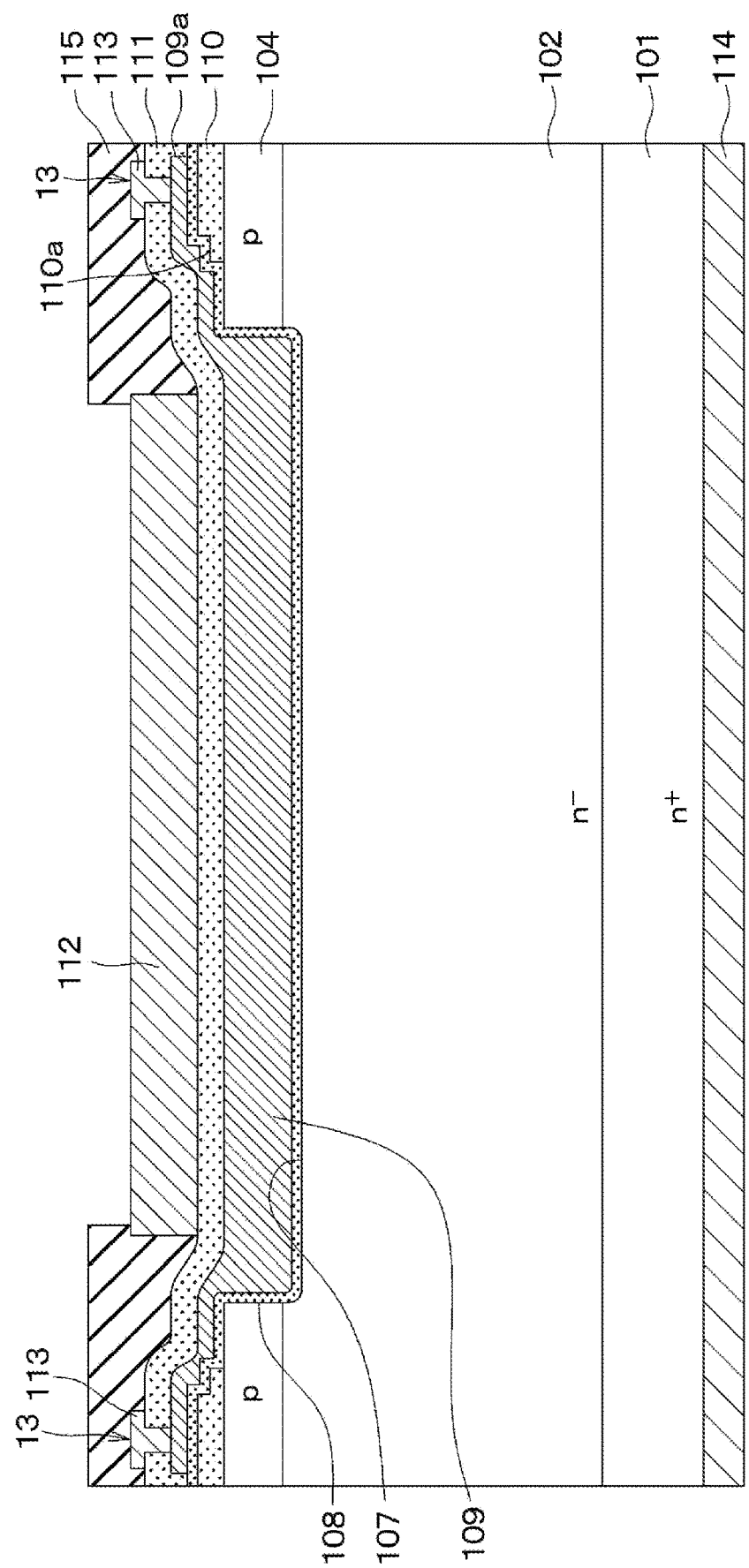
FIG. 8 is a cross-sectional view of a semiconductor device according to a second embodiment.
Figure 9A:
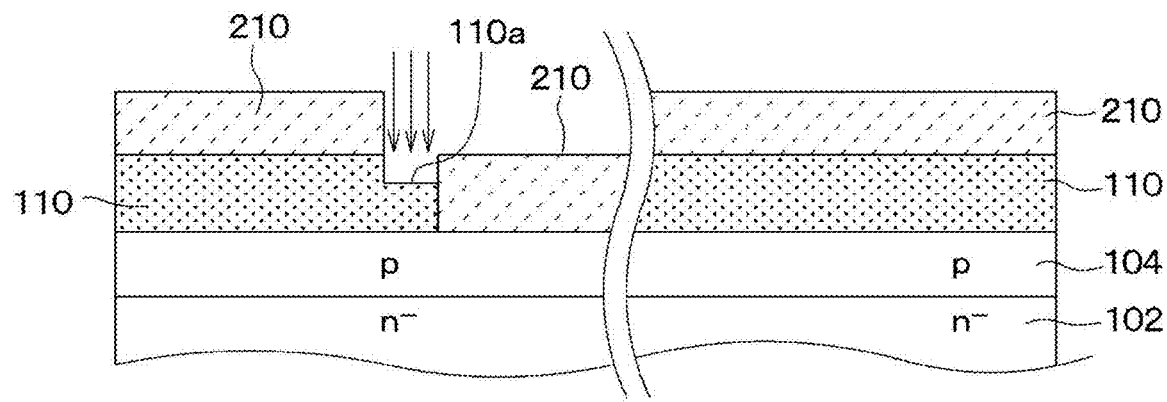
FIG. 9A is a cross-sectional view of a portion of an outer peripheral region adjacent to an active region and a portion of the outer peripheral region adjacent to a pad arrangement region in a process of forming an end portion of a field insulating film into a stepped shape.
Figure 9B:
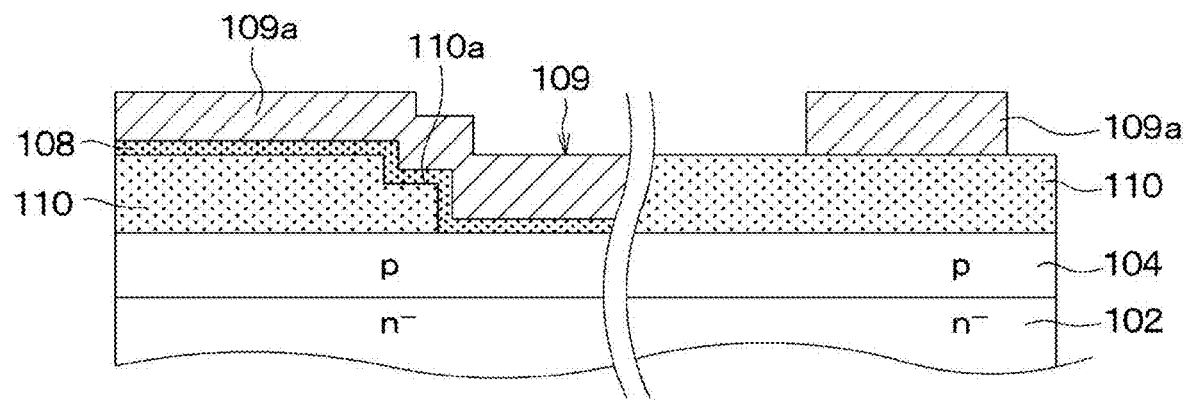
FIG. 9B is a cross-sectional view of the portion of the outer peripheral region adjacent to the active region and the portion of the outer peripheral region adjacent to the pad arrangement region in a process of forming a gate electrode after the process shown in FIG. 9A.

On the other hand, in the present embodiment, as shown in FIG. 8, the end portion 110a of the field insulating film 110 has a shape in which the thickness gradually increases stepwise, that is, the end portion 110a has is inclined stepwise. Such a shape is obtained by patterning the field insulating film 110 by dry etching and then dry etching the vicinity of the end portion 110a of the field insulating film 110 again, as shown in FIG. 9A. Specifically, a resist mask 210 in which only the vicinity of the end portion 110a of the field insulating film 110 is opened is arranged by photolithography, and the vicinity of the end portion of the field insulating film 110 is dry-etched while being covered with the resist mask 210. As a result, as shown in FIG. 9B, when the gate electrode 109 including the gate extraction portion 109a is formed as a post-process, the gate extraction portion 109a is also inclined stepwise along the shape of the end portion 110a of the field insulating film 110, and a step breakage of the gate extraction portion 109a can be suppressed. Even with such a structure, the same effect as in the first embodiment can be obtained. In this way, when the end portion 110a of the field insulating film 110 is inclined stepwise, regarding the relationship of Tg<L, it may be assumed that a straight line connecting tip positions of each step of the stepped shape is an inclined surface, and the inclined surface may be considered as a thickness transition region.

Third Embodiment

The following describes a third embodiment. The present embodiment is different from the first embodiment in that the structure of the field insulating film 110 is changed from that of the first embodiment and the other parts are similar to those of the first embodiment. Therefore, only the part different from the first embodiment will be described below.

Figure 10:
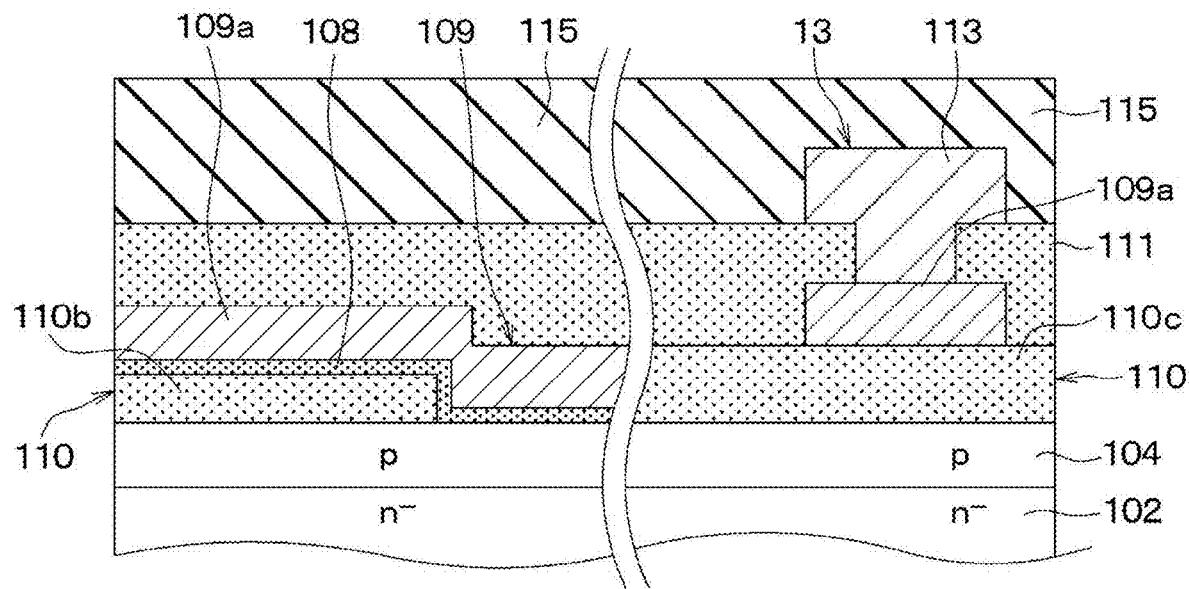
FIG. 10 is a cross-sectional view of a portion of an outer peripheral region adjacent to an active region and a portion of the outer peripheral region adjacent to a pad arrangement region in a semiconductor device according to a third embodiment.

As shown in FIG. 10, in the present embodiment, the film thickness of the field insulating film 110 is different depending on whether or not the end portion is located under the gate extraction portion 109a. Specifically, a portion of the field insulating film 110 located at a portion of the outer peripheral region Rb adjacent to the active region Ra, that is, a portion of the field insulating film 110 that constitutes the end portion above which the gate extraction portion 109a is disposed is formed as a thin film portion 110b in which the thickness is reduced. The thickness of the thin film portion 110b is preferably thinner than the thickness of the gate electrode 109. Further, a portion of the field insulating film 110 located in the pad arrangement region Rc and a portion of the outer peripheral region Rb adjacent to the pad arrangement region Rc, that is, a portion of the field insulating film 110 that constitutes the end portion above which the gate extraction portion 109a is not disposed is formed as a thick film portion 110c. The thick film portion 110c is thicker than the thin film portion 110b. With the above-described structure, a step portion due to the end portion of the field insulating film 110 located under the gate extraction portion 109a can be lowered. Therefore, even if the gate extraction portion 109a is disposed above the step portion, a step breakage of the gate extraction portion 109a can be suppressed. Furthermore, the field insulating film 110 can be made thick enough to suppress dielectric breakdown in the portion which is separated from the active region Ra and at which a high potential difference is generated between the gate wiring layer 113 and the semiconductor surface during switching. Accordingly, effects similar to the effects of the first embodiment can be achieved.

The method for manufacturing the semiconductor device having the above-described structure is basically similar to that of the first embodiment, but the thin film portion 110b and the thick film portion 110c are formed when forming the field insulating film 110 after preparing the semiconductor substrate on which each part is formed and forming the gate trench 107. For example, when forming the field insulating film 110, it is preferable to use a film forming process in which the film thickness of the field insulating film 110 changes depending on a device surface area, for example, plasma chemical vapor deposition (CVD).

Specifically, when the vertical MOSFET is formed as the switching element, a surface area in the active region Ra becomes larger than that in the pad arrangement region Rc because the gate trench 107 is formed in the active region Ra. Similarly, the portion of the outer peripheral area Rb adjacent to the active area Ra, that is, the portion located at both ends of the trench gate structure and at which the gate extraction portion 109a is disposed above the end portion 110a of the field insulating film 110 is close to the gate trench 107. Therefore, the device surface area per unit area becomes large. On the other hand, in a portion of the outer peripheral region Rb far from the active region Ra, that is, a portion located below the pad arrangement region Rc in FIG. 1, the device surface area becomes small because the surface unevenness is small.

Therefore, if the field insulating film 110 is formed by plasma CVD or the like, the thickness of the field insulating film 110 in the active region Ra and the portion of the outer peripheral region Rb adjacent to the active region Ra becomes thinner than that in the pad arrangement region Rc, so that the thin film portion 110b is formed. Then, in the portion of the pad arrangement region Rc and the portion of the outer peripheral region Rb that is far from the active region Ra, the field insulating film 110 becomes thick, so that the thick film portion 110c is formed. After that, the field insulating film 110 is patterned by dry etching or the like using a photomask (not shown), so that the structure as shown in FIG. 10 can be formed.

Other Embodiments

While the present disclosure has been described in accordance with the embodiments described above, the present disclosure is not limited to the embodiments and includes various modifications and equivalent modifications. In addition, while the various elements are shown in various combinations and configurations, which are exemplary, other combinations and configurations, including more, less or only a single element, are also within the spirit and scope of the present disclosure.

For example, in each of the above embodiments, the vertical MOSFET is given as an example as the switching element provided in the active region Ra. However, another switching element having a gate electrode, for example, a vertical IGBT may also be formed as the switching element, or a combination of multiple types of elements may also be formed. Further, the present disclosure can be applied not only to the switching element having the trench gate structure but also to a switching element of planar type having a structure in which the gate extraction portion 109a extracted out from the gate electrode 109 extending in one direction is disposed above the end portion of the field insulating film 110.

In the above embodiments, an example of the layout of the active region Ra, the outer peripheral region Rb, and the pad arrangement region Rc has been described, but the layout is not limited to the above-described example. For example, the trench gate structure does not have to be formed so as to extend from one side to the other side in the lateral direction of the semiconductor chip 10 in FIG. 1, and may be divided in the lateral direction. In such a case, the gate liner 13 can be laid out so as to pass between the trench gate structures divided in the lateral direction. In such a configuration, the field insulating film 110 can also be formed between the divided trench gate structures, and the gate extraction portion 109a can be disposed above the end portion of the field insulating film 110. The field insulating film 110 constituting this portion can also be formed in such a manner that the end portion of the field insulating film 110 is inclined as in the first and second embodiments, or the end portion of the field insulating film 110 is formed into the thin film portion 110b as in the third embodiment, so that the effects of each of the above-described embodiments can be obtained.

In the above-described embodiments, the pads 12a to 12d are disposed in the pad arrangement area Rc. However, the number of pads can be set optionally, and the number of pads may be any number according to the function to be provided. In the above embodiments, the active region Ra and the pad arrangement region Rc are surrounded by the outer peripheral region Rb, and these regions are arranged at different positions so as not to overlap. However, these regions may also be laid out so as to overlap. However, in the third embodiment, when the field insulating film 110 is formed based on a manufacturing process in which the thickness differs depending on the device surface area, the field insulating film 110 provided in the pad arrangement region Rc is formed at a position far from the active region Ra.

In the above-described embodiments, SiC and Si are taken as examples as the semiconductor material, but other semiconductor materials may also be used. However, particularly when SiC is used, it is preferable to apply the present disclosure because the working voltage is high and a high voltage is applied to the field insulating film 110.

What is claimed is:

1. A semiconductor device having an active region in which a switching element is disposed, an outer peripheral region surrounding an outer periphery of the active region, and a pad arrangement region in which one or more pads are disposed, the semiconductor device comprising;

a semiconductor substrate in which the switching element is disposed in the active region, the switching element having a gate electrode embedded in a plurality of gate trenches, the plurality of gate trenches extending in one direction as a longitudinal direction and arranged in a direction intersecting with the longitudinal direction so as to have a stripe shape;

a field insulating film disposed on the semiconductor substrate in the outer peripheral region and the pad arrangement region, the field insulating film having an end portion extending in the longitudinal direction of the plurality of gate trenches and the direction intersecting with the longitudinal direction of the plurality of gate trenches; and a gate extraction portion led out from the gate electrode and extending from the active region to the outer peripheral region along the longitudinal direction of the plurality of gate trenches so as to be disposed above the end portion of the field insulating film, wherein the one or more pads disposed in the pad arrangement region include a gate pad connected to the gate electrode through the gate extraction portion, the end portion of the field insulating film above which the gate extraction portion is disposed is inclined in such a manner that a thickness of the field insulating film increases in a direction from the active region toward the outer peripheral region along the longitudinal direction of the plurality of gate trenches, and when a region where the thickness of the field insulating film changes in the end portion of the field insulating film is defined as a thickness transition region, a width of the thickness transition region is L, and a thickness of a portion of the gate extraction portion other than a portion disposed above the thickness transition region is Tg, a relationship of Tg<L is satisfied.

2. The semiconductor device according to claim 1, wherein the end portion of the field insulating film above which the gate extraction portion is disposed has an inclined surface that is inclined obliquely.

3. The semiconductor device according to claim 1, wherein the end portion of the field insulating film above which the gate extraction portion is disposed is inclined in a stepped manner.

4. The semiconductor device according to claim 1, wherein a thickness of the gate electrode is thinner than the thickness of the field insulating film.

5. A semiconductor device having an active region in which a switching element is disposed, an outer peripheral region surrounding an outer periphery of the active region, and a pad arrangement region in which one or more pads are disposed, the semiconductor device comprising;

a semiconductor substrate in which the switching element is disposed in the active region, the switching element having a gate electrode embedded in a plurality of gate trenches, the plurality of gate trenches extending in one direction as a longitudinal direction and arranged in a direction intersecting with the longitudinal direction so as to have a stripe shape;

a field insulating film disposed on the semiconductor substrate in the outer peripheral region and the pad arrangement region, the field insulating film having an end portion extending in the longitudinal direction of the plurality of gate trenches and the direction intersecting with the longitudinal direction of the plurality of gate trenches; and a gate extraction portion led out from the gate electrode and extending from the active region to the outer peripheral region along the longitudinal direction of the plurality of gate trenches so as to be disposed above the end portion of the field insulating film, wherein the one or more pads disposed in the pad arrangement region include a gate pad connected to the gate electrode through the gate extraction portion, and every portion of the field insulating film located in the outer peripheral region and above which the gate extraction portion is disposed is a thin film portion, a portion of the field insulating film located in the pad arrangement region and above which the gate extraction portion is not disposed is a thick film portion, and a maximum thickness of the thin film portion is thinner than a maximum thickness of the thick film portion.

6. The semiconductor device according to claim 5, wherein the thickness of the thin film portion is thinner than a thickness of the gate electrode.

* * * * *